United States Patent
Choi et al.

(10) Patent No.: US 11,096,291 B2
(45) Date of Patent: Aug. 17, 2021

(54) METHOD FOR PLATING PRINTED CIRCUIT BOARD AND PRINTED CIRCUIT BOARD USING THE SAME

(71) Applicant: SAMSUNG ELECTRO-MECHANICS CO., LTD., Suwon-si (KR)

(72) Inventors: Jong Chan Choi, Suwon-si (KR); Young Kwon Jeong, Suwon-si (KR); Min Soo Kim, Suwon-si (KR); Seong Jae Mun, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/710,697

(22) Filed: Dec. 11, 2019

(65) Prior Publication Data
US 2020/0413548 A1    Dec. 31, 2020

(30) Foreign Application Priority Data
Jun. 25, 2019  (KR) .......................... 10-2019-0075748

(51) Int. Cl.
| | |
|---|---|
| H05K 3/42 | (2006.01) |
| C25D 3/18 | (2006.01) |
| C25D 3/38 | (2006.01) |
| H05K 1/02 | (2006.01) |
| H05K 1/11 | (2006.01) |

(52) U.S. Cl.
CPC .............. *H05K 3/423* (2013.01); *C25D 3/18* (2013.01); *C25D 3/38* (2013.01); *H05K 1/0298* (2013.01); *H05K 1/113* (2013.01); *H05K 1/115* (2013.01); *H05K 3/426* (2013.01); *H05K 2201/09563* (2013.01); *H05K 2203/1476* (2013.01); *H05K 2203/1492* (2013.01)

(58) Field of Classification Search
CPC ...... H05K 3/423; H05K 1/0298; H05K 1/113; H05K 1/115; H05K 3/426; H05K 2201/09563; H05K 2203/1492; H05K 2203/1476; H05K 2203/0703
USPC .......................................................... 174/266
See application file for complete search history.

(56) References Cited

U.S. PATENT DOCUMENTS

| | | | |
|---|---|---|---|
| 2015/0034378 A1* | 2/2015 | Kajihara | ................ H05K 3/427 174/266 |
| 2015/0156888 A1 | 6/2015 | Kawai | |
| 2018/0010258 A1 | 1/2018 | Fujiwara et al. | |

FOREIGN PATENT DOCUMENTS

| | | |
|---|---|---|
| JP | 2009-228124 A | 10/2009 |
| JP | 2015-106653 A | 6/2015 |

(Continued)

OTHER PUBLICATIONS

Japanese Office Action dated Feb. 9, 2021 in counterpart Japanese Patent Application No. 2020-013414 (5 pages in English)(3 pages in Japanese).

*Primary Examiner* — Sherman Ng
(74) *Attorney, Agent, or Firm* — NSIP Law

(57) ABSTRACT

A method for plating a printed circuit board, includes placing a substrate, including a through hole, in contact with a plating solution and disposing the substrate to face an electrode; and applying a pulsed current to each surface of the substrate, including applying pulsed currents of opposite polarity to both surfaces of the substrate at least once and applying pulsed forward currents to both surfaces of the substrate at least once, to plate from a middle to an end of the through hole.

15 Claims, 15 Drawing Sheets

(56) References Cited

FOREIGN PATENT DOCUMENTS

| JP | 2018-505960 | A | 3/2018 |
| KR | 10-2007-0053304 | A | 5/2007 |
| KR | 10-1222627 | B1 | 1/2013 |
| KR | 10-2014-0021618 | A | 2/2014 |

* cited by examiner

METHOD FOR PLATING PRINTED CIRCUIT BOARD AND PRINTED CIRCUIT BOARD USING THE SAME

CROSS-REFERENCE TO RELATED APPLICATIONS

This application claims the benefit under 35 USC 119(a) of Korean Patent Application No. 10-2019-0075748 filed on Jun. 25, 2019 in the Korean Intellectual Property Office, the entire disclosure of which is incorporated herein by reference for all purposes.

BACKGROUND

Field

The following description relates to a method for plating a printed circuit board. The following description also relates a printed circuit board made using the method for plating the printed circuit.

Description of Related Art

As the degree of integration of electronic components and printed circuit boards increases, high-speed signal transmission and high heat dissipation characteristics are increasingly required in printed circuit boards.

Through vias are formed in the form of plated through hole (PTH) structures for signal transmission in printed circuit boards. Because of the limitations of current plating technology, plating is performed only on the wall surface of the hole. The remaining portions of the hole are filled with insulating resin ink. However, because of the differences in coefficient of thermal expansion (CTE) between different materials, for example, copper and insulating resin, the reliability is low, and the heat dissipation characteristic is insufficient. Thus, it is difficult to apply such plating techniques to products requiring high heat dissipation characteristics.

Staggered vias, which are laminated multiple vias that are not situated around the same center, and stacked vias, which are laminated multiple vias together around the same center, have been used in order to enhance the heat dissipation characteristics of the printed circuit board. The heat dissipation characteristics may be improved through such vias, but cracks and delamination of interlayer vias generated by stacking the vias may be caused and noises such as signals associated with the stacked vias may also be caused.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for plating a printed circuit board, includes placing a substrate, comprising a through hole, in contact with a plating solution and disposing the substrate to face an electrode, and applying a pulsed current to each surface of the substrate, comprising applying pulsed currents of opposite polarity to both surfaces of the substrate at least once and applying pulsed forward currents to both surfaces of the substrate at least once, to plate from a middle to an end of the through hole.

A first pulsed current, applied to one surface of the substrate, may have a first cycle including a period for applying a reverse current, and a second pulsed current, applied to the other surface of the substrate, may have a second cycle including a period of temporal overlap with the period for applying the reverse current of the first pulsed current and a period for applying a forward current.

A 1-1 period for applying a reverse current and a 1-2 period for applying a forward current may occur during the first cycle, and a 2-1 period for applying a forward current having a high current density and a 2-2 period for applying a forward current having a current density lower than the 2-1 period may occur during the second cycle, wherein the 1-1 period of the first cycle and the 2-1 period of the second cycle may temporally overlap.

A 1-3 period for applying a forward current having a high current density higher than a current density of the 1-2 period and a 1-4 period for applying a forward current having a current density lower than a current density of the 1-3 period may further occur in the first cycle, and a 2-3 period for applying a reverse current and a 2-4 period for applying a forward current, each having a current density lower than a current density of the 2-1 period may further occur during the second cycle, wherein the 1-3 period of the first cycle and the 2-3 period of the second cycle may temporally overlap.

The plating solution may include a plating accelerator and a plating suppressor and the plating suppressor may have a molecular weight larger than the plating accelerator, the plating accelerator and the plating suppressor may be separated from the inner wall of the through hole and the surface of the substrate to which the reverse current is applied when the pulsed currents of opposite polarity are applied to both surfaces of the substrate, and a density of the plating accelerator may be concentrated at a center part of the through hole when the pulsed forward currents are applied to both surfaces of the substrate.

In another general aspect, a printed circuit board includes a substrate in which a through hole is formed, and a via filling the through hole and extending to both surfaces of the substrate, wherein the via includes a first plating layer formed in the through hole, extending to both surfaces of the substrate, and having a recessed groove formed in the surface of the substrate at both ends of the substrate, and a second plating layer filling the groove, formed on the first plating layer, and extending onto the substrate, wherein the first plating layer has a greater grain size at a region disposed at a lower part of the groove than a region disposed at a center part of the through hole.

The first plating layer may include a fine grain region extending to an inner wall at the center of the through hole, and a coarse grain region formed at a bottom part of the groove and surrounded by the fine grain region, wherein metal particles of the coarse grain region may be larger than metal particles of the fine grain region.

The fine grain region may extend along the inner wall of the through hole to a surface of the substrate.

The fine grain region may include a first fine grain region extending toward the inner wall at the center of the through hole, and a second fine grain region disposed between the first fine grain region and the coarse grain region and extending along the inner wall of the through hole toward the surface of the substrate, wherein metal particles of the second fine grain region may be smaller than metal particles of the first fine grain region.

A depth of the groove in the first plating layer may be 150 µm or less and a circuit pattern connected to the via may be formed on the substrate to have a thickness of 30 µm or less.

The printed circuit board may further include a seed layer located on an inner wall of the through hole and on a surface of the substrate, wherein the first plating layer may be an electroplating layer formed on the seed layer.

The printed circuit board may further include a copper foil layer located on the substrate and a seed layer located on an inner wall of the through hole and on the copper foil layer, wherein the first plating layer may be an electroplating layer formed on the seed layer.

The substrate may be an insulating material without a circuit layer located on the substrate.

The substrate may include a buildup layer having a plurality of circuit layers formed on the buildup layer.

A thickness of the first plating layer may be larger than a thickness of the second plating layer on the surface of the substrate.

In another general aspect, printed circuit board includes a substrate in which a through hole is formed, wherein a via fills the through hole and extends to both surfaces of the substrate, wherein the via includes a first plating layer formed in the through hole, and a second plating layer formed on the first plating layer, wherein the first plating layer has a fine grain region and a coarse grain region and wherein metal particles of the coarse grain region are larger than metal particles of the fine grain region.

The first plating layer may extend onto both surfaces of the substrate, and may have a recessed groove formed in the surface of the substrate at both ends of the substrate.

The second plating layer may fill the groove and may extend onto the substrate.

The fine grain region may extend along the inner wall of the through hole to a surface of the substrate.

The fine grain region may include a first fine grain region extending toward the inner wall at the center of the through hole, and a second fine grain region disposed between the first fine grain region and the coarse grain region and extending along the inner wall of the through hole toward the surface of the substrate, wherein metal particles of the second fine grain region may be smaller than metal particles of the first fine grain region.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
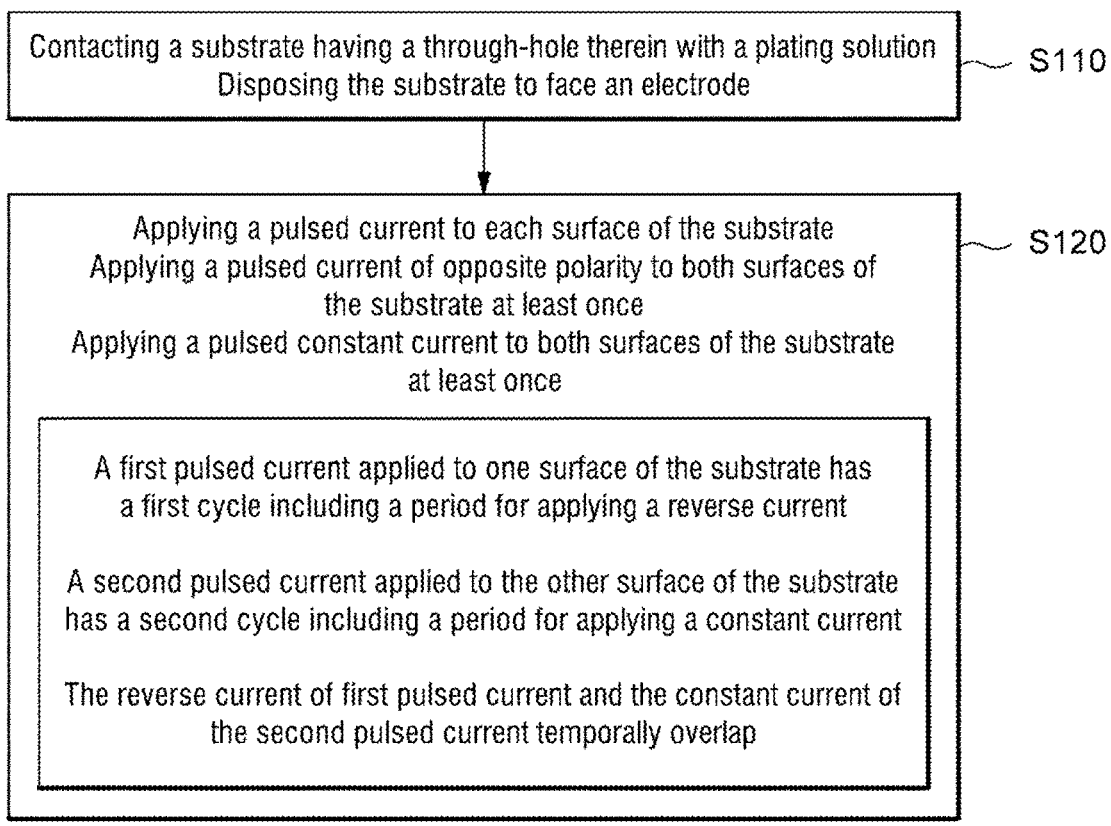
FIG. 1 is a flowchart illustrating a method of plating a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

When one element is described as being "connected", "coupled" or "bonded" to another element, it shall be construed as being connected, coupled or bonded to the other element directly but also as possibly having another element in between.

Hereinafter, various examples will be described separately, but it is not excluded that the description of any one example can be applied to other example. The description of any one example may be applied to other examples as long as the relationship is compatible.

This application includes examples that provide a method for plating a printed circuit board including forming vias capable of ensuring high-speed signal transmission and high heat dissipation characteristics, and a printed circuit board using the same.

Method for Plating a Printed Circuit Board

FIG. 1 is a flowchart illustrating a method of plating a printed circuit board according to an example. FIG. 2 to FIG. 5 are diagrams illustrating a method of plating a printed circuit board according to an example.

Referring to the example of FIG. 1, a method of plating a printed circuit board according to an example may include placing a substrate 10, in operation S110 and applying a pulsed current to both surfaces of the substrate 10, in operation S120.

In operation S110 of placing a substrate 10, the substrate 10 may be disposed for electrolytic plating. A through hole 13 may be formed in the substrate 10. Then, a via may be formed in the through hole 13 by plating.

The substrate 10, in which the through hole 13 is formed, may be placed in contact with a plating solution in order to be plated. For example, the substrate 10 may be immersed in a plating bath containing the plating solution.

The substrate 10 may be disposed to face to an electrode for plating. The electrode may cause a potential difference with the surface of the substrate 10 facing towards the electrode and may apply a current to the substrate 10. For example, the substrate 10 may be disposed between a pair of electrodes. Each surface of the substrate 10 may thus face the electrode. A seed layer 13a for plating may be formed on both surfaces of the substrate 10 and also on an inner wall of the through hole 13.

In operation S120 of applying a pulsed current to both surfaces of the substrate 10, current may be applied to one surface 10a and the other surface 10b of the substrate 10 to perform electroplating. In this operation S120, a pulsed current may be applied to the substrate 10. For example, a current may be applied to the substrate 10 by a periodic pulse reverse (PPR) method in this example. That is, the electrode may form a reverse current as well as a forward current with respect to the substrate 10 in the plating process.

Particularly, the plating method according to this example may include a process of applying a pulse of an opposite polarity to both surfaces of the substrate 10 at least once. For example, when a first pulsed current is applied to one surface 10a of the substrate 10 and a second pulsed current is applied to the other surface 10b of the substrate 10, the first pulsed current and the second pulsed current may have different polarities. In particular, the first pulsed current may have a first cycle C1, including a period for applying a reverse current, and the second pulsed current overlaps temporally with the period for applying a reverse current of the first pulsed current, and may have a second cycle C2 including a period for applying a forward current.

In this example, temporally overlapping means that two target periods exist for a predetermined time. In other words, it may be sufficient if there is a temporal area in which two periods are present at the same time, and the temporal length of each period, the start and end points, and the like may be thus set without any limitation.

The first cycle C1 of the first pulsed current and the second cycle C2 of the second pulsed current may have a repeating period, in one example. On the other hand, the cycle may end with one cycle. It may also be appropriate that the first cycle C1 and the second cycle C2 have the same period, but examples are not limited to examples where the first cycle C1 and the second cycle C2 have the same period. For example, in another example, the cycles may also have different periods from each other.

The plating method according to this example may include a process of applying a pulsed forward current to both surfaces of the substrate 10 at least once. For example, a first pulsed current and a second pulsed current may have the same polarity for plating on both surfaces of the substrate 10 during a certain period of time. In particular, a first cycle C1 of the first pulsed current may also include a period for applying a forward current and a second cycle C2 of the second pulsed current may temporally overlap with the period designated for applying a forward current.

Figure 2:
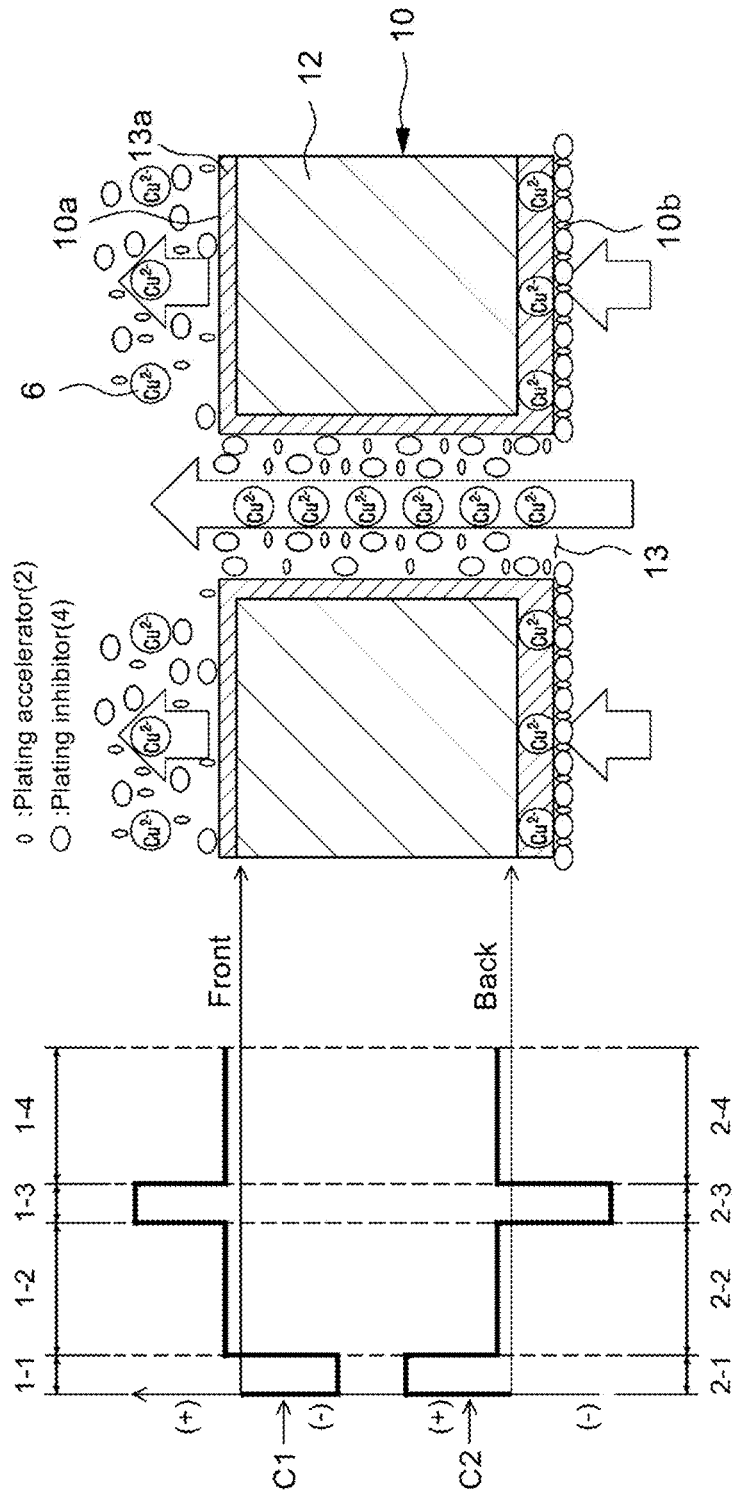
FIG. 2 to FIG. 5 are diagrams illustrating a method of plating a printed circuit board according to an example.
Figure 3:
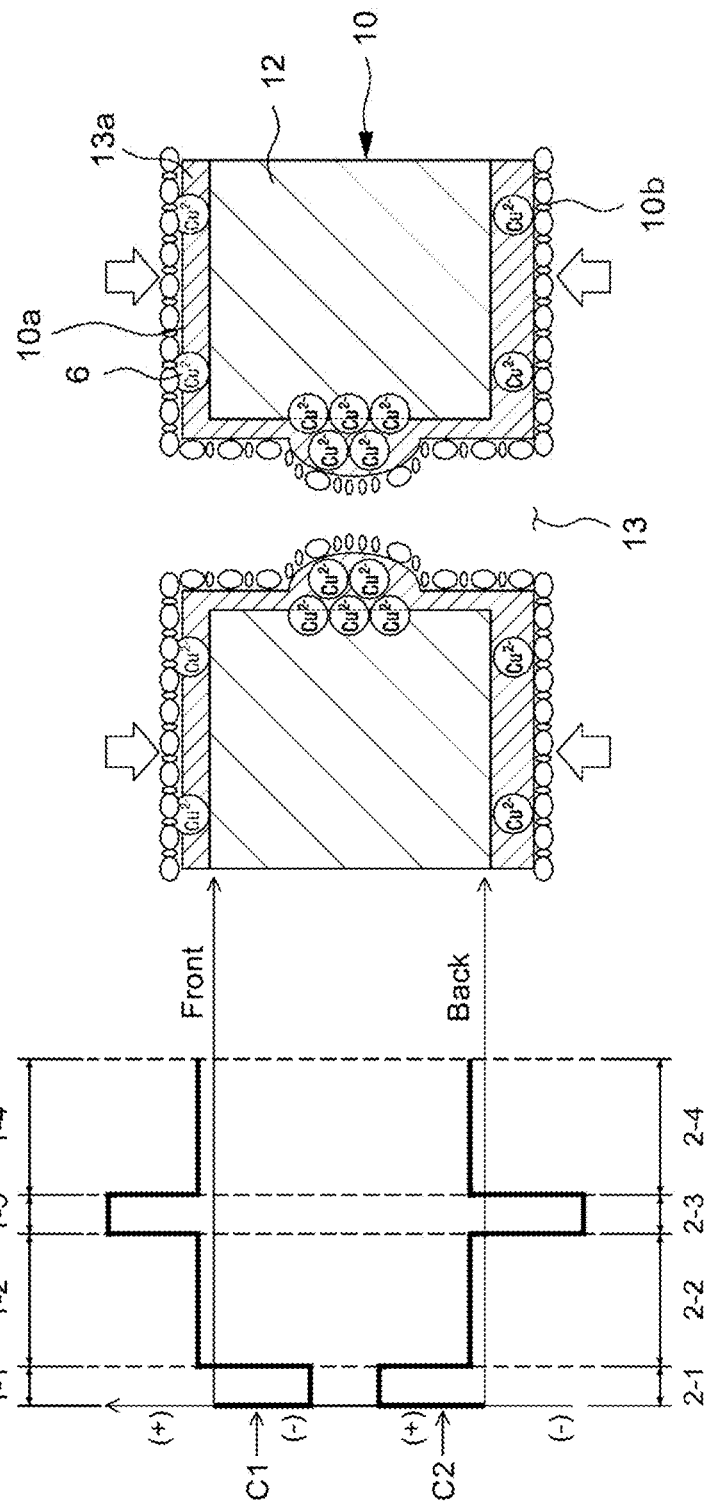

Referring to the examples of FIG. 2 and FIG. 3, a first electrode facing towards the first surface 10a of the substrate 10 may be disposed accordingly. The first electrode may form a potential difference from the first surface 10a of the substrate 10 to apply the first pulsed current. Here, a 1-1 period as shown in the examples FIG. 2 and FIG. 3 for applying a reverse current and a 1-2 period as shown in the examples FIG. 2 and FIG. 3 for applying a forward current may be formed in the first cycle C1 of the first pulsed current.

A second electrode facing towards the other surface 10b of the substrate 10 may be disposed accordingly. The second electrode may form a potential difference from the other surface 10b of the substrate 10 to apply the second pulsed current. Here, a 2-1 period for applying a forward current with a high current density, and a 2-2 period for applying a forward current with a current density lower than the 2-1 period, may be formed in the second cycle C2 of the second pulsed current.

Referring to the example of FIG. 2, the 1-1 period of the first cycle and the 2-1 period of the second cycle may temporally overlap in order to apply pulses of opposite polarities to both surfaces of the substrate 10. In other words, a reverse current may be applied to one surface 10a of the substrate 10 by the first pulsed current. A forward current may be applied to the other surface 10b of the substrate 10 by the second pulsed current during a predetermined time period.

Plating may be generated on the other surface 10b of the substrate 10 to which the forward current is applied while plating may be decomposed on the one surface 10a of the substrate 10 to which the reverse current is applied. The reverse current may be applied to the one surface 10a of the substrate 10 to cause a plating additive such as a plating accelerator 2 and a plating suppressor 4 to separate from the other surface 10b of the substrate 10. Thus, the plating accelerator 2 and the plating suppressor 4 may also be separated from the inner wall of the through hole 13.

By contrast, because the first electrode facing the one surface 10a of the substrate 10 may become a cathode and the second electrode facing the other surface 10b of the substrate 10 may become an anode, cations 6 such as metal ions in the plating solution may move toward the first electrode. Accordingly, a flow of the cations 6 toward the first electrode may be formed in the through hole 13 of the substrate 10 as well.

In such an example, values of the reverse current of the first pulsed current and the forward current of the second pulsed current may be adjusted in order to control the plating decomposition on the one surface 10a of the substrate 10, the separation of the plating additive and/or the flow of the cations 6 such as metal ions in the through hole 13. In this example, the reverse current of the first pulsed current and the forward current of the second pulsed current may be set to have similar current values with respect to the surface of the substrate 10 to which they are applied. Thus, the reverse current of the first pulsed current and the forward current of the second pulsed current may be set to have opposite polarities, but to have similar current values. The values of the first pulsed current and the second pulsed current may also be set to have higher current values compared to values when the forward current is applied to both surfaces of the substrate 10, for example, values occurring during the 1-2 period and the 2-2 period.

Referring to the example of FIG. 3, the 1-2 period of the first cycle C1 and the 2-2 period of the second cycle may temporally overlap in order to apply a forward current pulse of the same polarity to both surfaces of the substrate 10. In other words, the forward current may be applied to both surfaces of the substrate 10 simultaneously for a predetermined time by applying the first pulsed current and the second pulsed current.

Plating may be generated on both surfaces of the substrate 10 to which the forward current is applied. In particular, when the forward current is applied to both surfaces of the substrate 10 after applying the opposite polarity to both surfaces of the substrate 10, plating may be formed by a filling process from the middle to the end of the through hole 13. In particular, as described above, when the pulses of opposite polarity are applied on both surfaces of the substrate 10, the plating accelerator 2 and the plating suppressor 4 may be separated from the inner wall of the through hole 13 and the surface of the substrate 10 to which the reverse current is applied. A density of the plating accelerator 2 may be concentrated in the middle of the through hole 13 when the pulsed forward current is applied to both surfaces of the substrate 10, so that the plating may be formed by filling from the middle to the end of the through hole 13.

The plating accelerator 2 included in the plating solution is known to accelerate a plating rate in a specific region/part. The plating solution may also include the plating suppressor 4 in addition to the plating accelerator 2. For example, the lower the concentration of the plating suppressor 4 is, the easier the adsorption of the plating accelerator 2 to the substrate 10 becomes and the more significant the effect of the plating acceleration 2 is.

The plating solution may include the plating accelerator 2 and the plating suppressor 4. The plating suppressor 4 may have a molecular weight larger than the plating accelerator 2. For example, the plating accelerator 2 may be an organic material, for example, bis(sodiumsulfopropyl) disulfide (SPS), mercaptopropylsulfonic acid (MPS), 3-N,N-Dimethylaminodithiocarbamoyl-1-propanesulfonic acid (DPS), 3-S-isothiuronium propyl sulfonate (UPS), 3-(benzothiazolyl-2-mercapto)-propyl-sulfonic acid sodium salt (ZPS), and so on, including a disulfide bond (—S—S) or a mercapto group (—SH). The plating suppressor 4 may be an organic material, for example, and organic material including a polyether-based polymer material and having a functional group containing a nitrogen atom. However, these are only example materials, and alternative materials with appropriate properties may be used in other examples. Accordingly, by making this selection of materials, the plating suppressor 4 may have a molecular weight larger than the plating accelerator 2 when presented as a polymer.

As illustrated in the example of FIG. 3, when the forward current is applied to both surfaces of the substrate 10 after applying the current of the opposite polarity to both surfaces of the substrate 10, the plating additives, such as the plating accelerator 2 and the plating suppressor 4, may be adsorbed to the substrate 10. However, the flow of the plating solution may be disturbed in the through hole 13 of the substrate 10, as compared with the surface of the substrate 10. As a result, a relatively fast flow rate may occur on the surface of the substrate 10 as compared with the flow occurring on the inside of the through hole 13, the plating suppressor 4 may be adsorbed rapidly, and the plating accelerator 2 may act relatively less in different locations, accordingly. By contrast, the re-adsorption process of the plating suppressor 4 may be delayed, but the adsorption of the plating accelerator 2 having a smaller molecular weight or a smaller size may be relatively facilitated in the through-hole 13 having a slower flow rate. A density of the plating accelerator 2 may thus increase in the through hole 13, which further increases an acceleration effect of the plating to concentrate the plating growth inside the through hole 13. In such an example, because the density of the plating suppressor 4 increases on the surface of the substrate 10, plating on the surface of the substrate 10 may be minimized due to the suppressive effects caused by the plating suppressor 4.

The plating method according to this example may include applying the reverse current on the other surface 10b of the substrate 10 and the forward current, which temporally overlaps with the reverse current, on the one surface 10a of the substrate 10 in order to uniformly plate the both surfaces of the substrate 10. That is, a plating process may be performed symmetrically by using the above-described plating process, while the surface of the substrate 10 is reversed. In particular, the second cycle C2 of the second pulsed current may include a period for applying a reverse current. The first cycle C1 of the first pulsed current may include a period of overlap with the period for applying a reverse current of the second pulsed current and for applying a forward current. The first cycle C1 of the first pulsed current and the second cycle C2 of the second pulsed current each may include a period for applying a second forward current. Hence, the periods for applying the second forward current may temporally overlap.

Figure 4:
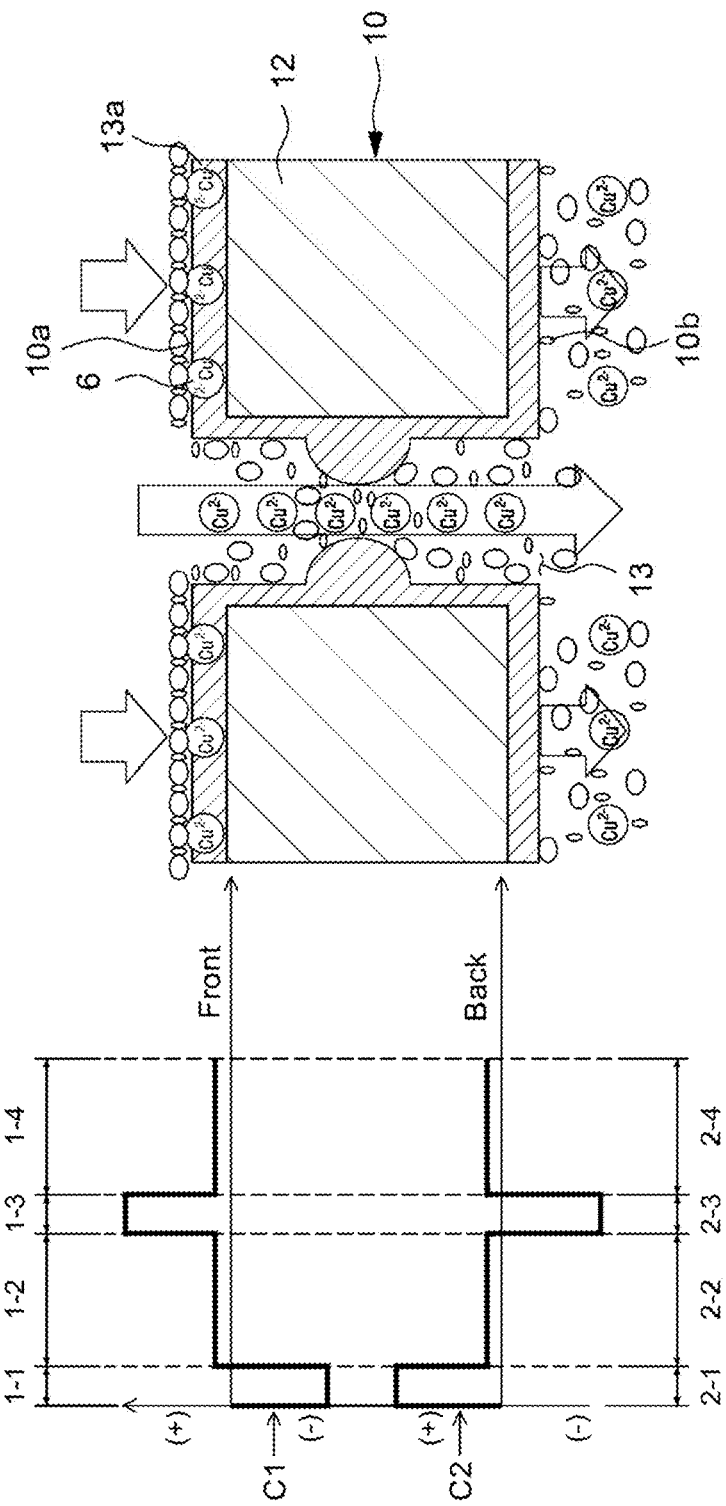
Figure 5:
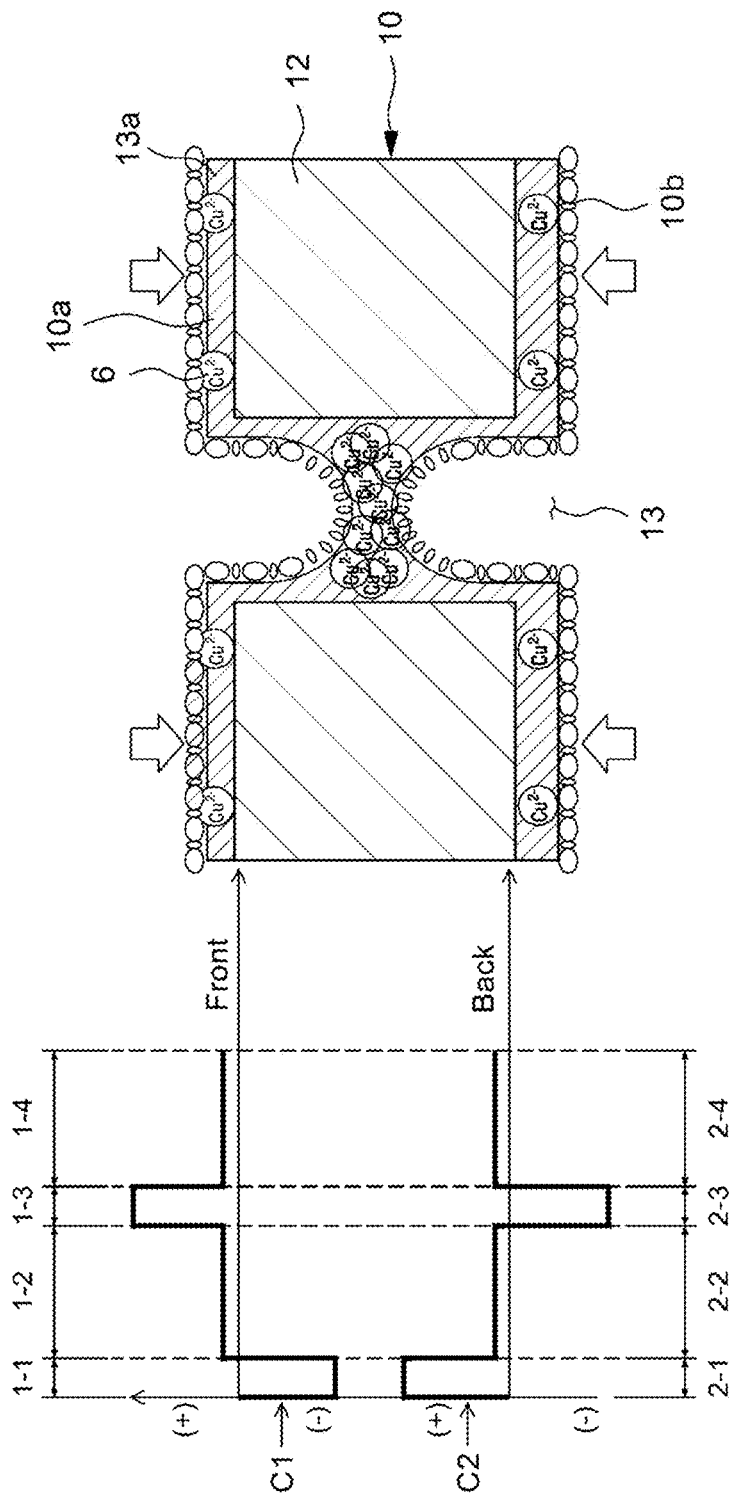

Referring to the examples of FIG. 4 and FIG. 5, a 1-3 period for applying a forward current with a high current density greater than the 1-2 period and a 1-4 period for applying a forward current with a current density less than the 1-3 period may be further formed in the first cycle. In addition, a 2-3 period for applying a reverse current and a 2-4 period for applying a forward current with a current density less than the 2-1 period may be further formed in the second cycle. For example, the 1-3 period of the first cycle and the 2-3 period of the second cycle may temporally overlap to apply a pulse of opposite polarity to both surfaces of the substrate 10. In this example, the phenomena occurring on one surface 10a and the other surface 10b of the substrate 10 may exhibit a direction opposite to the phenomenon described with reference to the examples of FIG. 2 and FIG. 3. In other words, the phenomenon occurring on one surface 10a of the substrate 10 in FIG. 2 and FIG. 3 may occur on the other surface 10b of the substrate 10 in the examples of FIG. 4 and FIG. 5, and the phenomenon occurring on the other surface 10b of the substrate 10 in the examples of FIG. 2 and FIG. 3 may occur on one surface 10a of the substrate 10 in the examples of FIG. 4 and FIG. 5. However, a density of the plating accelerator 2 may increase in the through hole 13, an acceleration effect of the plating may increase, and plating growth may intensively occur in the through hole 13, regardless of the directionality involved.

Therefore, when the first pulsed current and the second pulsed current, respectively having the first cycle C1 and the second cycle C2 illustrated in the examples of FIG. 2 to FIG. 5, are applied to both surfaces of the substrate 10, a uniform plating may be formed symmetrically on both surfaces of the substrate and the inside of the through hole 13 may be filled with plating material from the middle to both of its ends. In such an example, the plating of both surfaces of the substrate 10 may be continuously suppressed during the growth of the thickness, so that the through hole 13 may be kept from being grown too thick in the process of its being filled with the plating.

In this example, the corresponding periods in the first cycle C1 and the second cycle C2 temporally overlap, but examples are not limited to satisfying such a condition. For example, it may be sufficient if the corresponding periods in the first cycle C1 and the second cycle C2 overlap for a certain period of time, and the temporal length, the start and end points, and the like of each period may thus be set differently as well.

Printed Circuit Board

Figure 6:
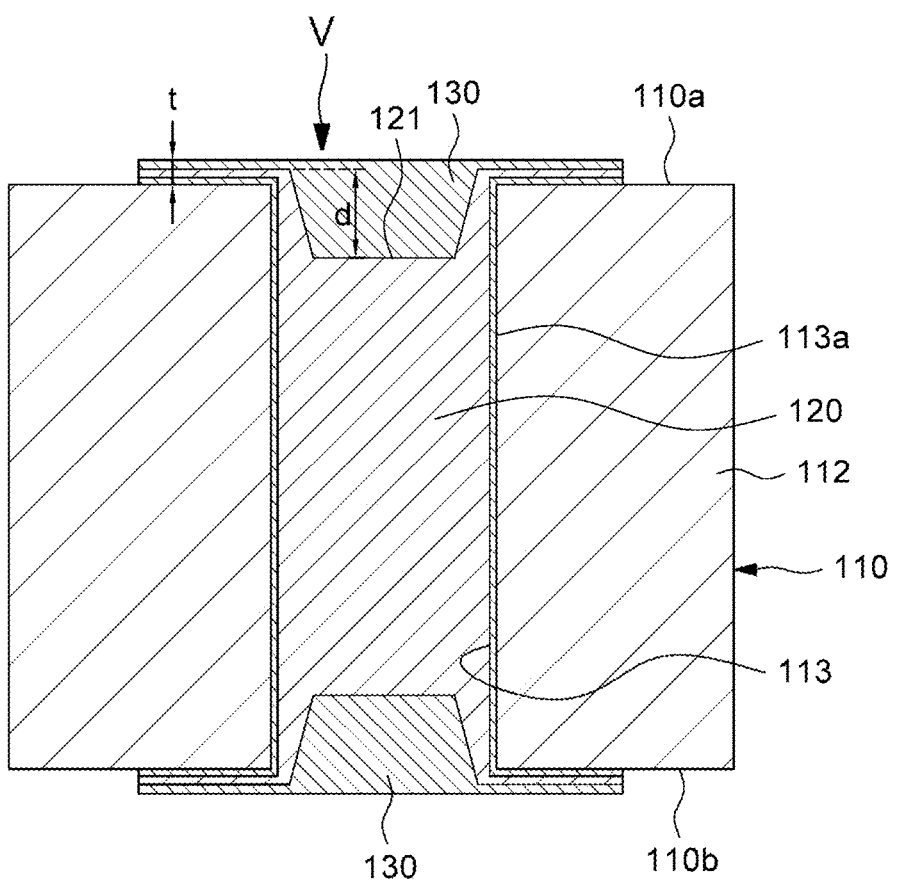
FIG. 6 is a diagram illustrating a printed circuit board according to an example.

FIG. 6 is a diagram illustrating a printed circuit board according to an example.

Referring to FIG. 6, a printed circuit board 110 according to an example may include a substrate 110 and a via V, wherein the via V may include a first plating layer 120 and a second plating layer 130.

The substrate 110 may be a part of the printed circuit board 110 where a circuit is formed, and may additionally include an insulating layer that electrically insulates circuit patterns. A through hole 113 may be formed in the substrate 110 to form the via V that connects the circuit patterns on both surfaces of the substrate 110.

Referring to the example of FIG. 6, the substrate 110 of this example may be formed of an insulating material 112 having no circuit layer located within. For example, the substrate 110 may be formed of a thick core insulating material having a thickness of 0.3 mm or more. In the example of FIG. 6, the through hole 113 having a diameter of 150 μm or more may be formed by a mechanical process, such as a drilling process.

The via V may be a part that connects circuit patterns formed on both surfaces of the substrate 110 as a part of the circuits. The via V may be made of a conductive material and may include a metal such as copper, but the via V may also be made of other appropriate materials. The via V may have a structure that fills the through hole 113 formed in the substrate 110 and also extends to both surfaces of the substrate 110.

The via V may include a first plating layer 120 and a second plating layer 130. The first plating layer 120 may be formed in the through hole 113 and may have a recessed groove 121 formed in the surface of the substrate 110. For example, both ends of the first plating layer 120 may also extend to both surfaces of the substrate 110, but the recessed groove 121 may be formed at both ends of the first plating layer 120. Also, the bottom of the groove 121 may be formed to be lower than the surfaces 110a and 110b of the substrate 110.

Figure 7:
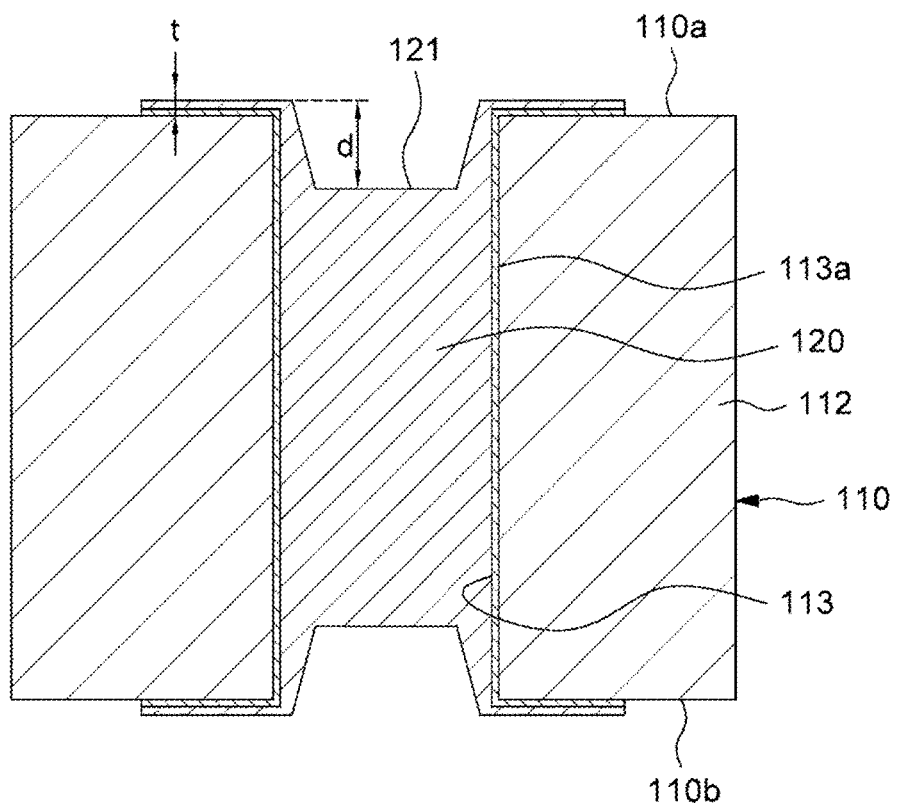
FIG. 7 is a diagram illustrating a first plated layer of a printed circuit board according to an example.

FIG. 7 is a diagram illustrating a first plated layer of a printed circuit board according to an example. FIG. 7 shows a case of an example in which the first plating layer 120 is formed before the second plating layer 130 is formed.

Referring to the examples of FIG. 6 and FIG. 7, the first plating layer 120 may be formed so as to fill the inside of the through hole 113 without a gap, except for a part of both ends of the through hole 113. The end part of the first plating layer 120 may extend along the inner wall of the through hole 113 over the surface of the substrate 110. That is, the first plating layer 120 may extend to most portions of the via V.

In such an example, a seed layer 113a may be formed on the inner wall of the through hole 113, and the first plating layer 120 may be an electroplating layer formed on the seed layer 113a. As described in the above-described plating method, the seed layer 113a may be formed on the surface of the substrate 110 and the through hole 113 for electroplating. The first plating layer 120 may be formed as the electroplating layer, extending from the middle to the end of the through hole 113 by using the plating method described above.

The second plating layer 130 may be formed on the first plating layer 120 and filled in the groove 121 and may also be extended to the substrate 110. For example, the second plating layer 130 may be formed on the first plating layer 120 by performing an additional plating after the first plating layer 120 is formed, and the groove 121 may be filled with the second plating layer 130.

Referring to the examples of FIG. 6 and FIG. 7, the second plating layer 130 may fill the end of the through hole 113 that remains after being filled with the first plating layer 120 and extends to the land of the via V to be uniformly formed on the first plating layer 120. That is, the second plating layer 130 may be formed in the form of a blind via on the first plating layer 120 having the recessed groove 121 so as to be an integrated via V.

A circuit pattern connected to the via V may be formed on the substrate 110. A depth d of the groove 121 in the first plating layer 120 may be 150 μm or less and a thickness of the circuit pattern may be 30 μm or less, because a thickness of the circuit pattern in this embodiment may be similar to a thickness of the land of the via V, the thickness of the circuit pattern may be expressed by the thickness t of the land of the via V. Accordingly, after the first plating layer 120 is formed as shown in the example of FIG. 7, the groove 121 having a depth of 150 μm or less may be filled appropriately and a fine circuit pattern having a thickness of 30 μm or less may be formed by a single plating process. The second plating layer 130 may be formed by the plating process used for forming the circuit pattern.

The thickness of the first plating layer 120 on the surface of the substrate 110 may be greater than the thickness of the second plating layer 130. For example, the thickness of the first plating layer 120 formed on the substrate 110 may be adjusted by adjusting current conditions and the like that occur when the plating layer is grown in the through hole 113 by the above-described plating method.

The first plating layer 120 of this example may be formed to have regions having different grain sizes by the above-described plating method. In particular, the first plating layer 120 may have a grain size larger at a region 126 of the bottom of the groove 121 than those grain sizes 122 and 124 of the center of the through-hole 113.

Figure 8:
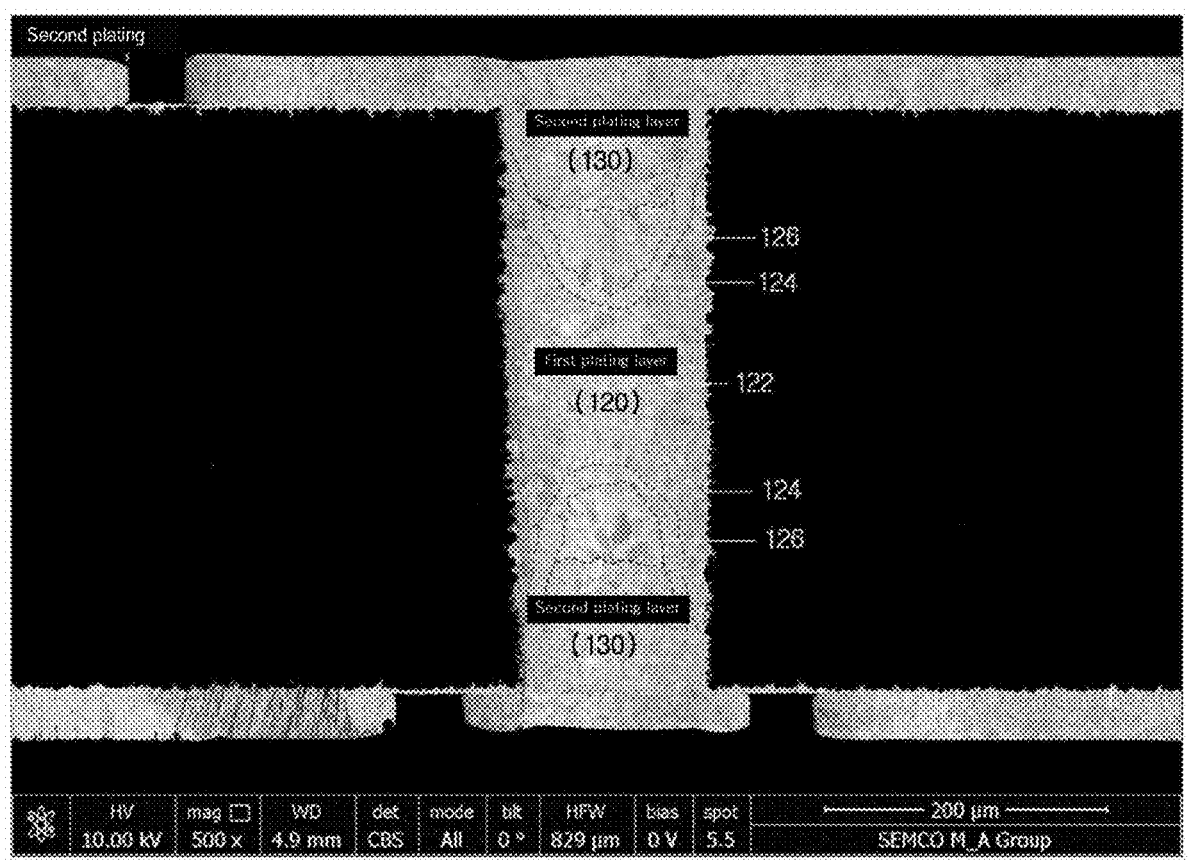
FIG. 8 to FIG. 10 are photographs illustrating vias of a printed circuit board according to an example.
Figure 9:
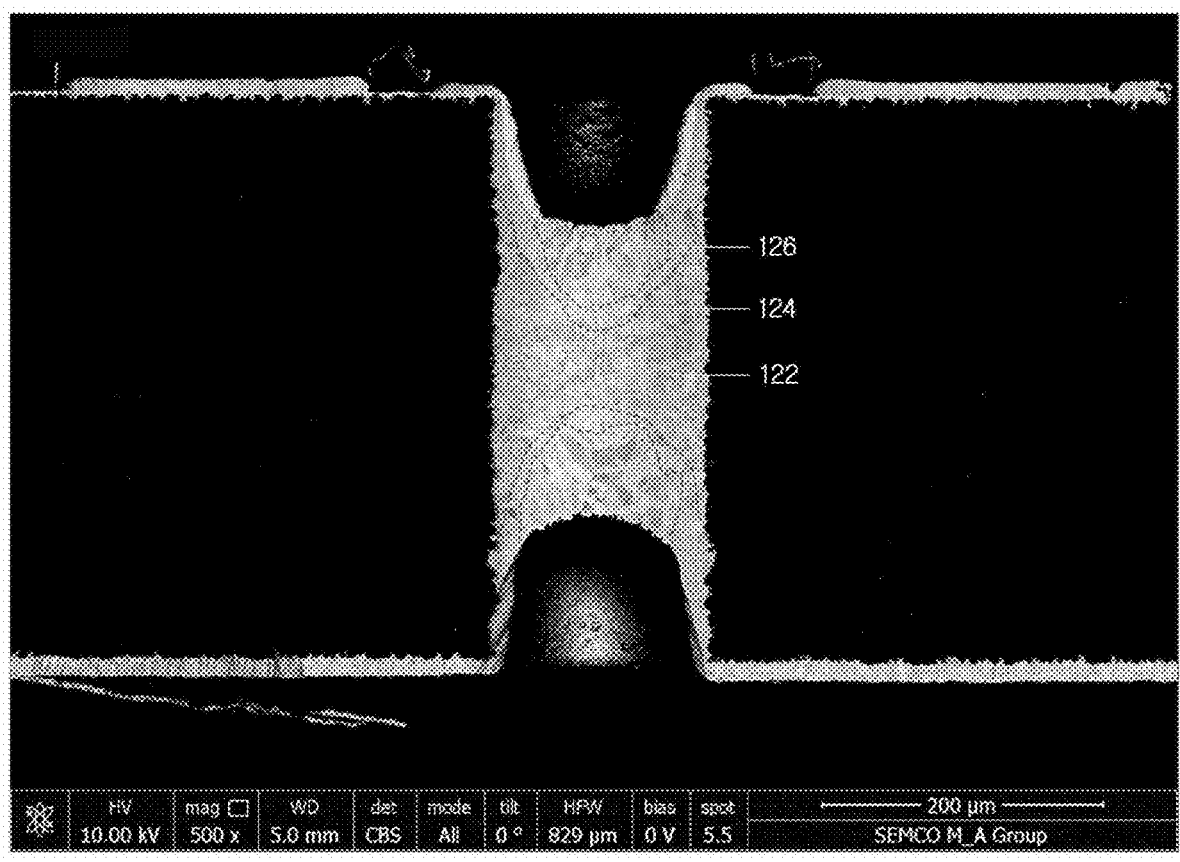
Figure 10:
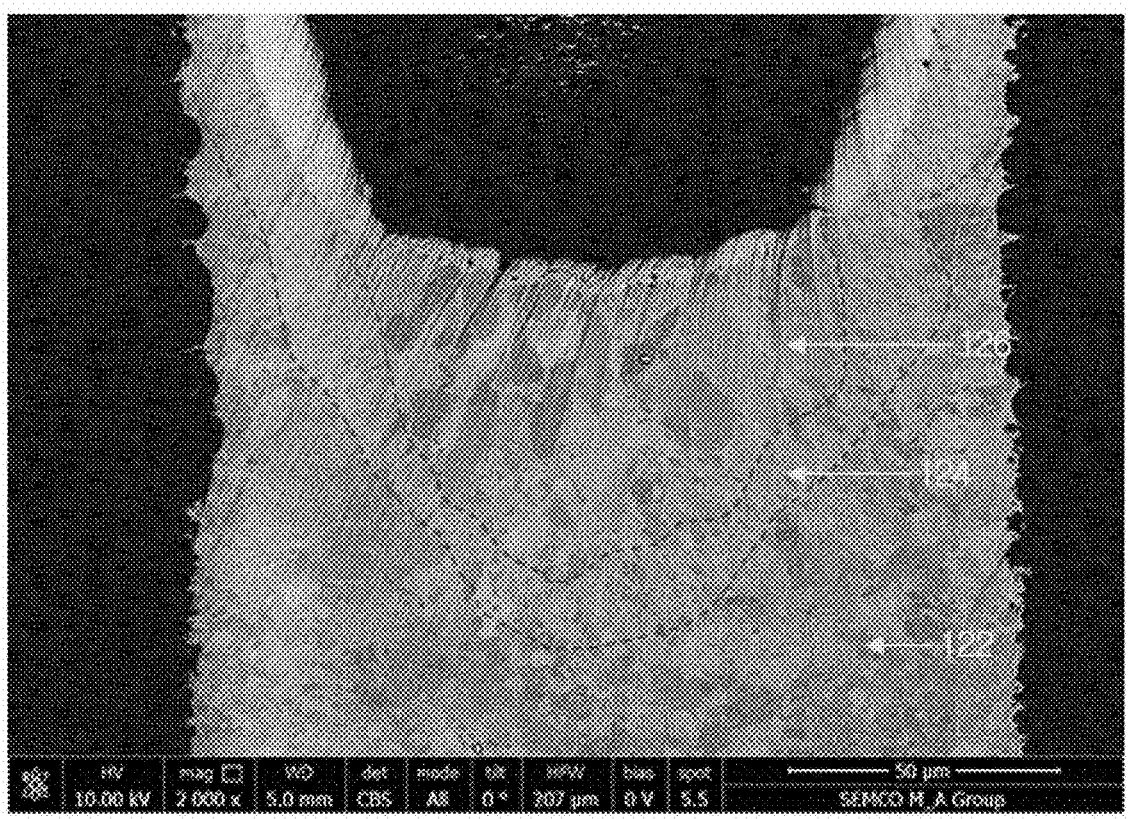
Figure 10:
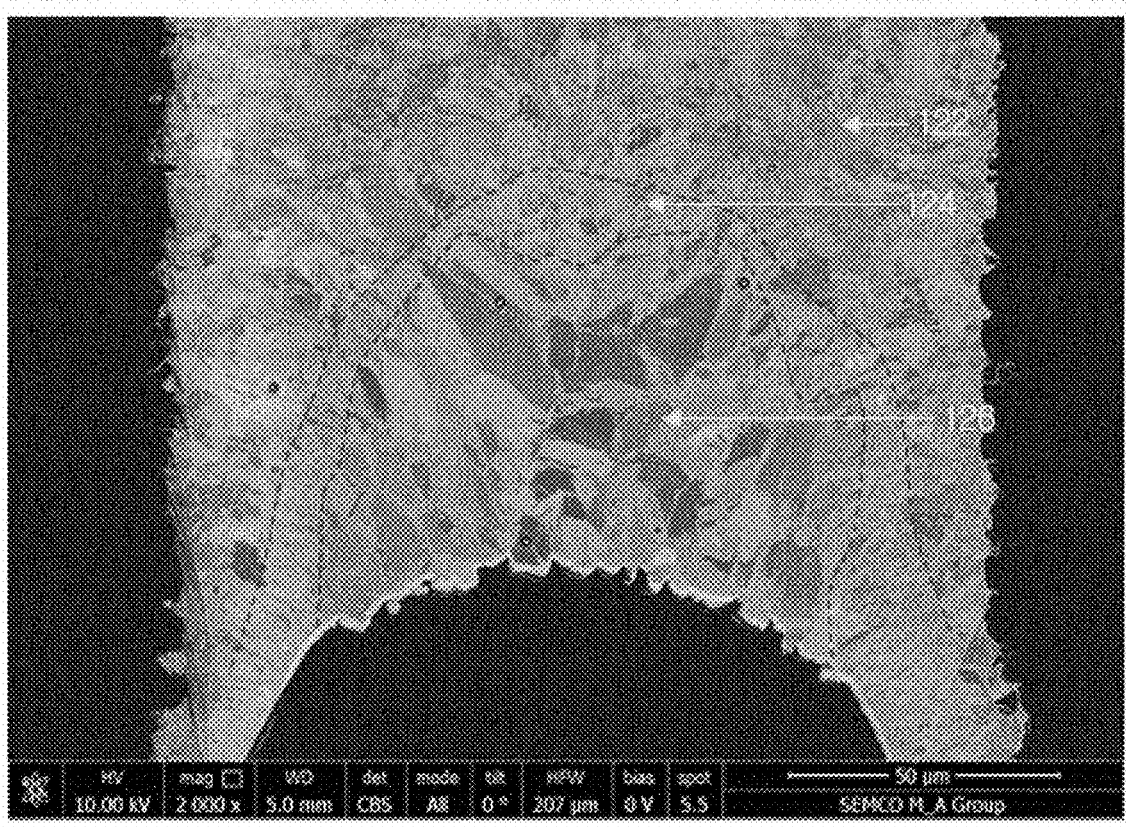

FIG. 8 to FIG. 10 are photographs illustrating vias V of a printed circuit board according to an example. FIG. 9 shows a case in which the first plating layer 120 is formed before the second plating layer 130 is formed in the example of FIG. 8. FIG. 10 is an enlarged view of the first plating layer 120 shown in the example of FIG. 9.

Referring to the examples of FIG. 8 to FIG. 10, the first plating layer 120 may include fine grain regions 122 and 124 and also a coarse grain region 126. Grain clusters may be aggregates of crystal lattices grown from a single crystal nucleus. Cross sections of a metal or alloy may be identified in the form of such particles by using a microscope or a similar magnifying device. The first plating layer 120 may be divided into two regions because the size of the grains are clearly distinct from each other.

The fine grain regions 122 and 124 may be formed at the central part of the through hole 113 and the inner wall of the through hole 113 and may also have a shape extending toward the inner wall of the through hole 113 at the center part of the through hole 113. That is, the first plating layer 120, near the inner wall of the through hole 113, may be mostly the fine grain regions 122 and 124. The first plating layer 120, only in the middle part in the thickness direction of the substrate near the center of the through hole 113, may be the fine grain regions 122 and 124.

Referring to the example of FIG. 9, the fine grain regions 122 and 124 may have a structure extending to the surface of the substrate 110 along the inner wall of the through hole 113.

The coarse grain region 126 may be formed such that the metal particles are larger than the metal particles in the fine grain regions 122 and 124. The coarse grain region 126 may also be formed under the groove 121. The coarse grain region 126 may also be surrounded by the fine grain regions 122 and 124.

The fine grain region of this example may be divided into two regions 122 and 124, in which the sizes of the crystal grains are divided again.

Referring to the example of FIG. 10, the fine grain region may be divided into 2 regions including fine grain regions 122 and 124 at the end of the first plating layer 120. Particularly, the fine grain region may include the first fine grain region 122 extending toward the inner wall in the central part of the through hole 113 and the second fine grain region 124 between the fine grain regions 122 and the coarse grain region 126 and extending toward the surface of the substrate 110 along the inner wall of the through hole 113. In such an example, metal particles of the second fine grain region 124 may be formed to be smaller than metal particles of the first fine grain region 122. Alternatively put, most of the fine grain region may be formed as the first fine grain region 122. Also, the second fine grain region 124 having a smaller particle size may be formed around the boundary of the fine grain regions contacted with the coarse grain region 126.

Figure 11:
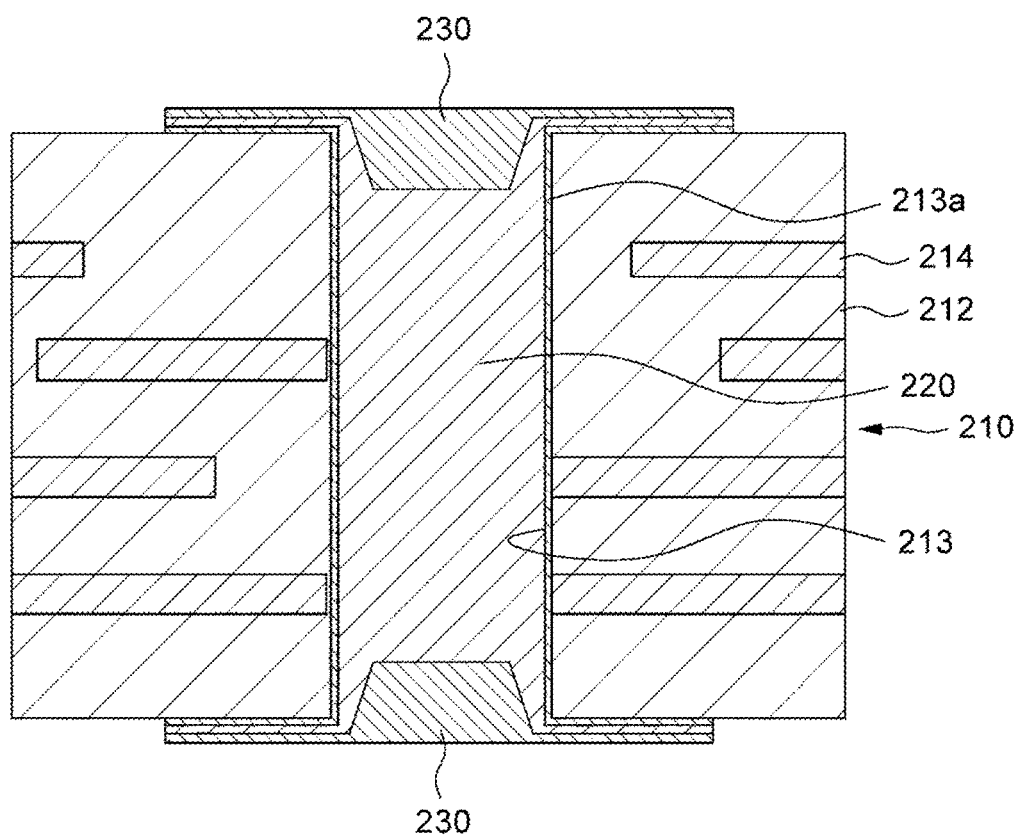
FIG. 11 is a diagram illustrating a printed circuit board according to an example.

FIG. 11 is a diagram illustrating a printed circuit board according to an example.

A printed circuit board according to this example may be different from the above-described example in a structure of a substrate 210 in which a through hole 213 is formed. That is, a seed layer 213a, a first plating layer 220, a second plating layer 230, and other relevant elements may be similar to the above-described example. However, their description will not be repeated where redundant, for brevity.

Referring to the example of FIG. 11, the substrate 210 according to this example may include a buildup layer in which a plurality of circuit layers are formed. For example, the buildup layer may have a plurality of insulating layers 212, such that the plurality of insulating layers 212 are laminated in order and inner circuit patterns 214 are formed between the insulating layers 212.

Figure 12:
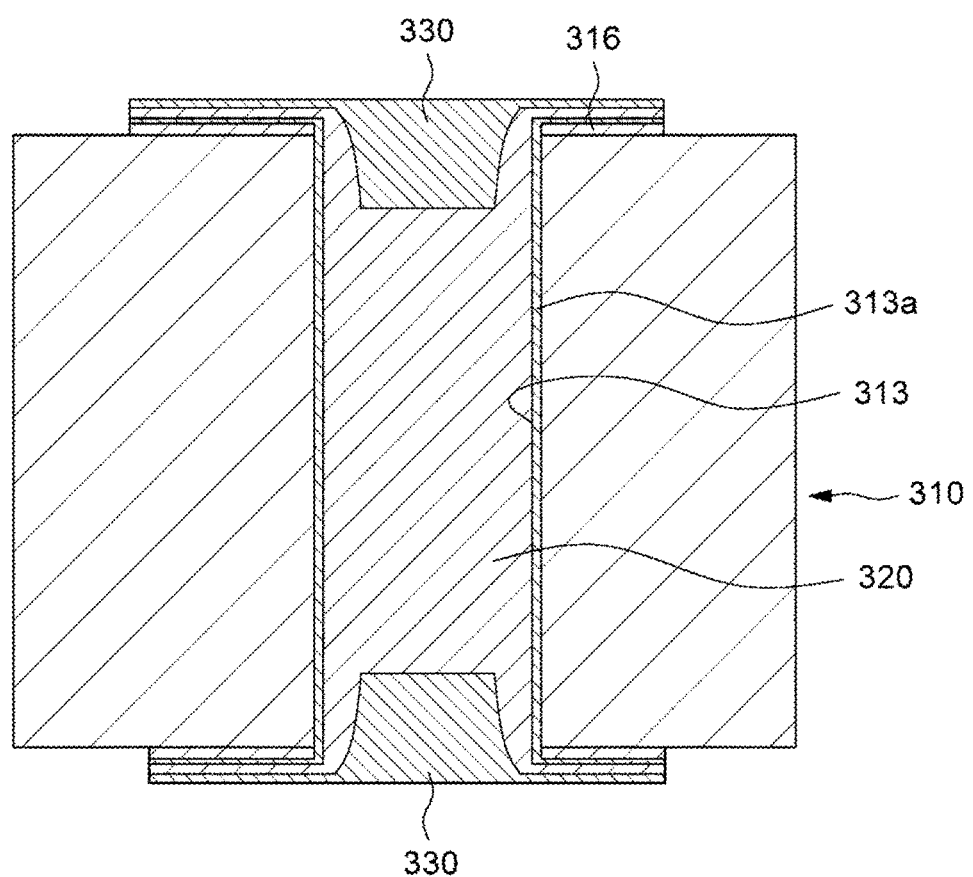
FIG. 12 is a diagram illustrating a printed circuit board according to an example.

FIG. 12 is a diagram illustrating a printed circuit board according to an example.

A printed circuit board according to this example may be different from the above-described examples in that a copper foil layer 316 is formed on a substrate 310. That is, a seed layer 313a, a first plating layer 320, a second plating layer 330, and the like may be similar to the above-described example.

Referring to FIG. 12, the substrate 310 of this example may be formed using a copper clad laminate having copper foils on both surfaces of an insulating material. The insulating material of the copper clad laminate may become the substrate 310. The copper foil of the copper clad laminate may remain in the copper foil layer 316 to form a part of circuit patterns or a via V.

In particular, the copper foil layer 316 may be formed on the substrate 310, and the seed layer 313a of the first plating layer 320 may be formed on the copper foil layer 316. Accordingly, the seed layer 313a of the first plating layer 320 may have a structure formed on the inner wall of the through hole 313 and the copper foil layer 316. Also, the first plating layer 320 may be formed on the seed layer 316 as in the above-described example.

Figure 13:
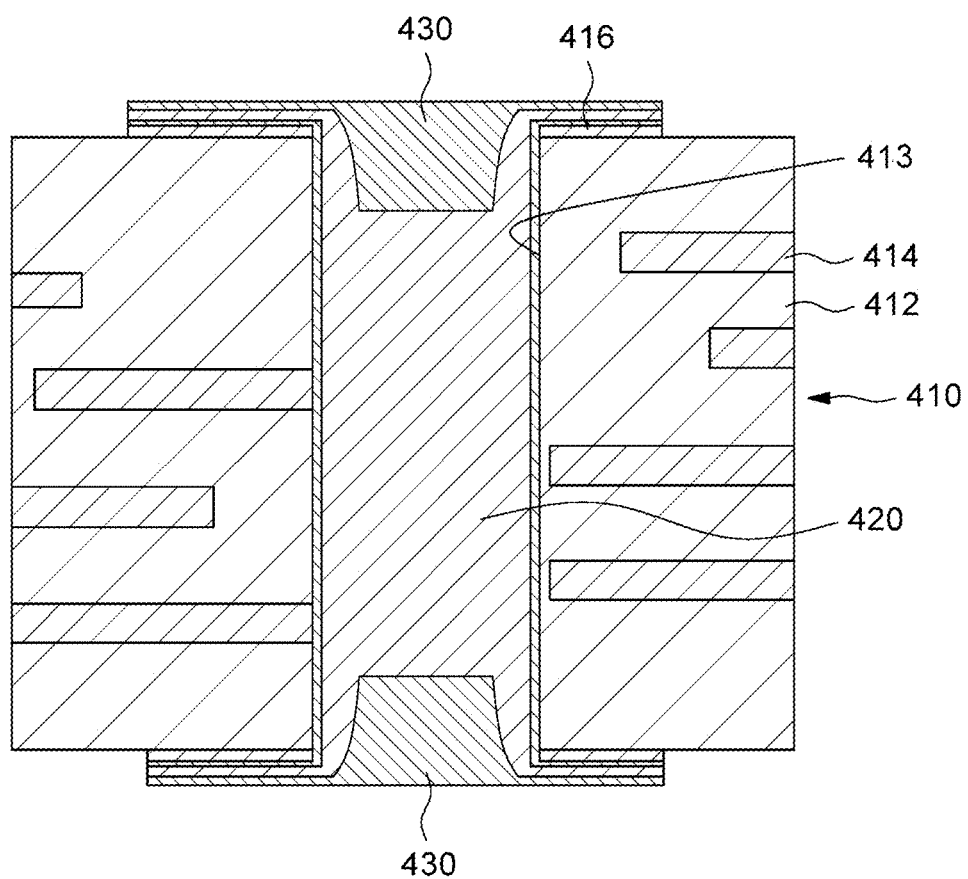
FIG. 13 is a diagram illustrating a printed circuit board according to an example.

FIG. 13 is a diagram illustrating a printed circuit board according to an example.

A printed circuit board according to this example may be different from the above-described example, the example of FIG. 12, in a structure of a substrate 410 on which a through hole 413 is formed. Thus, a seed layer 413a, a copper foil layer 416, a first plating layer 420, a second plating layer 430, and other elements may be similar to those of the previous example.

Referring to the example of FIG. 13, the substrate 410 according to this example may include a buildup layer having a plurality of insulating layers 412. The plurality of insulating layers 412 may be laminated in order, and inner circuit patterns 414 may be formed between the insulating layers 412.

Figure 14:
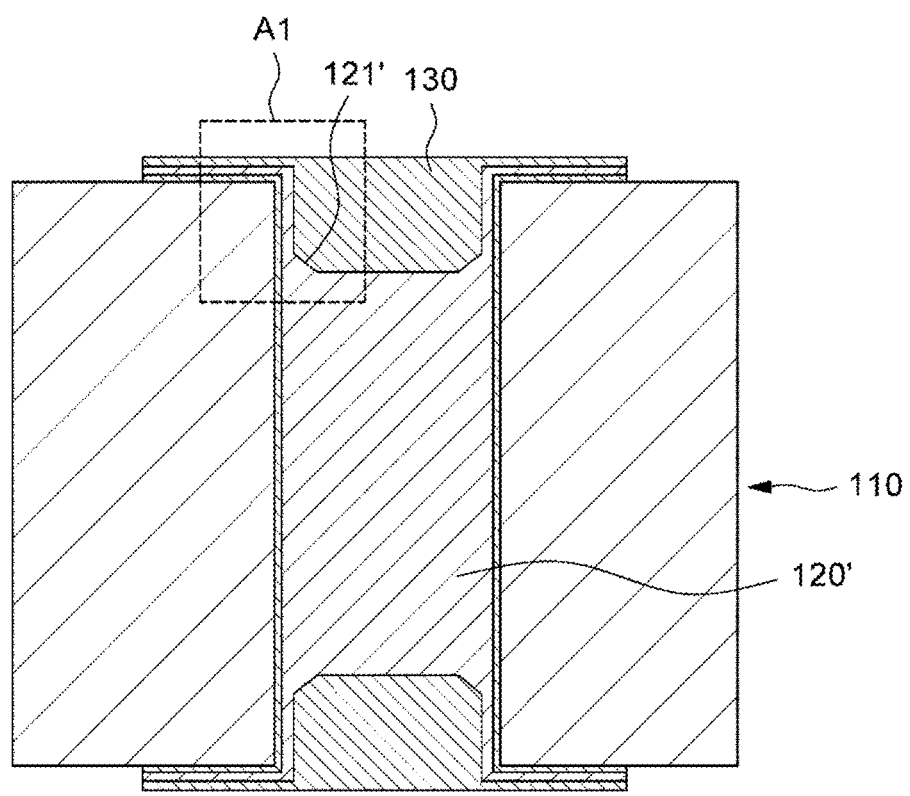
FIG. 14 is a diagram illustrating a printed circuit board according to an example.
Figure 15:
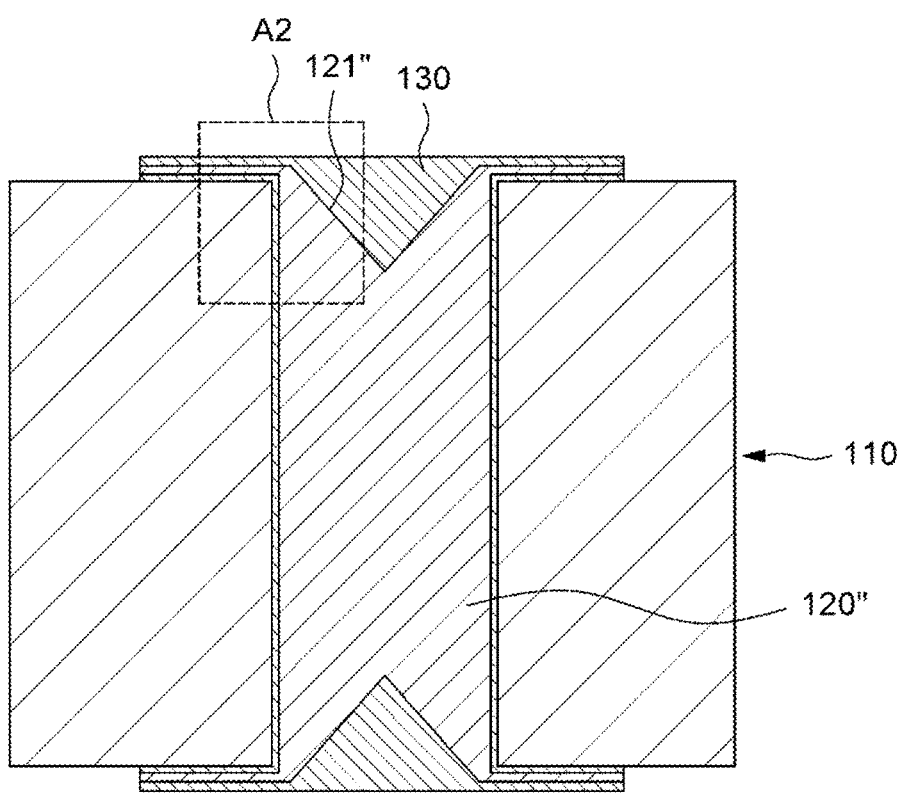
FIG. 15 is a diagram illustrating a printed circuit board according to an example.

FIG. 14 is a diagram illustrating a printed circuit board according to an example, and FIG. 15 is a diagram illustrating a printed circuit board according to an example.

These examples of FIG. 14 and FIG. 15 illustrate modified examples of the groove 121 of the first plating layer 120. In the above-described examples, the groove 121 of the first plating layer 120 has a structure similar to a groove in which a general blind via is formed, but the shape of the groove 121 may be not limited to such a structure, and the groove 121 has other appropriate shapes in other examples.

Referring to the example of FIG. 14, a side wall of a groove 121' in the first plating layer 120 may be formed to have a very steep shape A1, so as to be substantially perpendicular to the bottom of the groove 121'.

Referring to the example of FIG. 15, a groove 121" of the first plating layer 120 may be formed in a pointed structure A2 so that the bottom of the groove 121" may be substantially not formed. For example, the groove 121" may have a structure in which the second plating layer 130, which may be filled in the inside, has an inverted conical structure and converges to a point with its inner diameter narrowed downward.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a substrate in which a through hole is formed; and
a via filling the through hole and extending to both surfaces of the substrate,
wherein the via comprises
a first plating layer formed in the through hole, extending to both surfaces of the substrate, and having a recessed groove formed in the surface of the substrate at both ends of the substrate, and
a second plating layer filling the groove, formed on the first plating layer, and extending onto the substrate,
wherein the first plating layer has a greater grain size at a region disposed at a lower part of the groove than a region disposed at a center part of the through hole.

2. The printed circuit board of claim 1, wherein the first plating layer comprises:
a fine grain region extending to an inner wall at the center of the through hole; and
a coarse grain region formed at a bottom part of the groove and surrounded by the fine grain region,
wherein metal particles of the coarse grain region are larger than metal particles of the fine grain region.

3. The printed circuit board of claim 2, wherein the fine grain region extends along the inner wall of the through hole to a surface of the substrate.

4. The printed circuit board of claim 3, wherein the fine grain region comprises:
a first fine grain region extending toward the inner wall at the center of the through hole; and
a second fine grain region disposed between the first fine grain region and the coarse grain region and extending along the inner wall of the through hole toward the surface of the substrate,
wherein metal particles of the second fine grain region are smaller than metal particles of the first fine grain region.

5. The printed circuit board of claim 1, wherein a depth of the groove in the first plating layer is 150 μm or less and a circuit pattern connected to the via is formed on the substrate to have a thickness of 30 μm or less.

6. The printed circuit board of claim 1, further comprising a seed layer located on an inner wall of the through hole and on a surface of the substrate, wherein the first plating layer is an electroplating layer formed on the seed layer.

7. The printed circuit board of claim 1, further comprising a copper foil layer located on the substrate and a seed layer located on an inner wall of the through hole and on the copper foil layer, wherein the first plating layer is an electroplating layer formed on the seed layer.

8. The printed circuit board of claim 1, wherein the substrate is an insulating material without a circuit layer located on the substrate.

9. The printed circuit board of claim 1, wherein the substrate comprises a buildup layer having a plurality of circuit layers formed on the buildup layer.

10. The printed circuit board of claim 1, wherein a thickness of the first plating layer is larger than a thickness of the second plating layer on the surface of the substrate.

11. A printed circuit board comprising:
a substrate in which a through hole is formed, wherein a via fills the through hole and extends to both surfaces of the substrate,
wherein the via comprises
a first plating layer formed in the through hole, and
a second plating layer formed on the first plating layer,
wherein the first plating layer has a fine grain region and a coarse grain region and wherein metal particles of the coarse grain region are larger than metal particles of the fine grain region.

12. The printed circuit board of claim 11, wherein the first plating layer extends onto both surfaces of the substrate, and has a recessed groove formed in the surface of the substrate at both ends of the substrate.

13. The printed circuit board of claim 11, wherein the second plating layer fills the groove and extends onto the substrate.

14. The printed circuit board of claim 11, wherein the fine grain region extends along the inner wall of the through hole to a surface of the substrate.

15. The printed circuit board of claim 11, wherein the fine grain region comprises:
- a first fine grain region extending toward the inner wall at the center of the through hole; and
- a second fine grain region disposed between the first fine grain region and the coarse grain region and extending along the inner wall of the through hole toward the surface of the substrate,
- wherein metal particles of the second fine grain region are smaller than metal particles of the first fine grain region.

* * * * *